(12) United States Patent
Anholt et al.

(10) Patent No.: US 9,136,879 B2
(45) Date of Patent: *Sep. 15, 2015

(54) ERROR CORRECTION CODING OVER MULTIPLE MEMORY PAGES

(71) Applicant: Apple Inc., Cupertino, CA (US)

(72) Inventors: Micha Anholt, Tel Aviv (IL); Or Ordentlich, Tel Aviv (IL); Naftali Sommer, Rishon le-Zion (IL); Ofir Shalvi, Ra'anana (IL)

(73) Assignee: Apple Inc., Cupertino, CA (US)

( * ) Notice: Subject to any disclaimer, the term of this patent is extended or adjusted under 35 U.S.C. 154(b) by 155 days.

This patent is subject to a terminal disclaimer.

(21) Appl. No.: 13/921,446

(22) Filed: Jun. 19, 2013

(65) Prior Publication Data

US 2013/0283122 A1    Oct. 24, 2013

Related U.S. Application Data

(63) Continuation of application No. 12/890,724, filed on Sep. 27, 2010, now Pat. No. 8,495,465.

(60) Provisional application No. 61/251,807, filed on Oct. 15, 2009.

(51) Int. Cl.
*G11C 29/00* (2006.01)
*H03M 13/29* (2006.01)
*G06F 11/10* (2006.01)
*G11C 29/18* (2006.01)

(52) U.S. Cl.
CPC ........... *H03M 13/29* (2013.01); *G06F 11/1012* (2013.01); *G11C 29/00* (2013.01); *G11C 2029/1804* (2013.01)

(58) Field of Classification Search
CPC .......... G11C 2029/1804; G11C 29/00; H03M 13/29
USPC .................................................... 714/763, 773
See application file for complete search history.

(56) References Cited

U.S. PATENT DOCUMENTS

| | | | |
|---|---|---|---|
| 4,856,003 A | 8/1989 | Weng | |
| 7,409,623 B2 * | 8/2008 | Baker et al. | 714/763 |
| 7,734,993 B2 | 6/2010 | Krachkovsky et al. | |
| 8,732,553 B2 | 5/2014 | Nagadomi et al. | |
| 2003/0196157 A1 | 10/2003 | Kern et al. | |
| 2005/0193312 A1 * | 9/2005 | Smith et al. | 714/755 |
| 2009/0282308 A1 * | 11/2009 | Gutsche et al. | 714/746 |
| 2010/0077279 A1 * | 3/2010 | Kim et al. | 714/755 |

* cited by examiner

*Primary Examiner* — M. Mujtaba K Chaudry
(74) *Attorney, Agent, or Firm* — Meyertons, Hood, Kivlin, Kowert & Goetzel, P.C.

(57) ABSTRACT

A method for data storage includes encoding each of multiple data items individually using a first Error Correction Code (ECC) to produce respective encoded data items. The encoded data items are stored in a memory. The multiple data items are encoded jointly using a second ECC, so as to produce a code word of the second ECC, and only a part of the code word is stored in the memory. The stored encoded data items are recalled from the memory and the first ECC is decoded in order to reconstruct the data items. Upon a failure to reconstruct a given data item from a respective given encoded data item by decoding the first ECC, the given data item is reconstructed based on the part of the code word of the second ECC and on the encoded data items other than the given encoded data item.

20 Claims, 2 Drawing Sheets

ERROR CORRECTION CODING OVER MULTIPLE MEMORY PAGES

CROSS-REFERENCE TO RELATED APPLICATIONS

This application is a continuation of U.S. patent application Ser. No. 12/890,724 filed Sep. 27, 2010 which claims the benefit of U.S. Provisional Patent Application 61/251,807, filed Oct. 15, 2009, whose disclosure is incorporated herein by reference.

FIELD OF THE INVENTION

The present invention relates generally to data storage, and particularly to methods and systems for error correction coding in memory systems.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. This analog value represents the information stored in the cell. In Flash memories, for example, each analog memory cell holds a certain amount of electrical charge. The range of possible analog values is typically divided into intervals, each interval corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible programming levels. Higher-density devices, often referred to as Multi-Level Cell (MLC) devices, store two or more bits per memory cell, i.e., can be programmed to assume more than two possible programming levels.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the 24$^{th}$ International Conference on Microelectronics (MIEL), Nis, Serbia and Montenegro, May 16-19, 2004, volume 1, pages 377-384, which is incorporated herein by reference.

Memory systems often apply Error Correction Coding (ECC) techniques to the stored data in order to increase storage reliability and reduce the likelihood of readout errors. For example, U.S. Patent Application Publication 2009/0013233, whose disclosure is incorporated herein by reference, describes apparatus and methods for storing error recovery data in different dimensions of a memory array. In example embodiments, in one dimension, block error correction codes are used, and in another dimension, supplemental error correction codes, such as convolutional codes, are used. In one example, block error correction codes are used for data stored along rows, and this data is stored in one level of multiple-level cells of the array. Supplemental error correction codes are used for data stored along columns, such as along the cells of a string, and the supplemental error correction codes are stored in a different level than the error correction codes.

As another example, U.S. Patent Application Publication 2010/0169743, whose disclosure is incorporated herein by reference, describes a solid state disk that includes a non-volatile memory and a controller. The controller performs ECC on data stored on the non-volatile memory, and performs a parity operation on the data if the ECC cannot correct the data.

SUMMARY OF THE INVENTION

An embodiment of the present invention that is described herein provides a method for data storage, including:

encoding each of multiple data items individually using a first Error Correction Code (ECC) to produce respective encoded data items, and storing the encoded data items in a memory;

encoding the multiple data items jointly using a second ECC, so as to produce a code word of the second ECC, and storing only a part of the code word in the memory;

recalling the stored encoded data items from the memory and decoding the first ECC in order to reconstruct the data items; and upon a failure to reconstruct a given data item from a respective given encoded data item by decoding the first ECC, reconstructing the given data item based on the part of the code word of the second ECC and on the encoded data items other than the given encoded data item.

In some embodiments, the code word of the second ECC includes data bits and redundancy bits, and the part of the code word includes only the redundancy bits of the code word. In an embodiment, encoding the multiple data items using the second ECC includes calculating a bitwise Exclusive OR (XOR) over the multiple data items, and applying the second ECC to the bitwise XOR. In a disclosed embodiment, reconstructing the given data item includes calculating an interim bitwise XOR over the given data item and over the decoded and reconstructed data items other than the given data item, decoding the second ECC for an interim code word including the interim bitwise XOR and the stored redundancy bits, and deriving the given data item from the decoded interim code word and the decoded and reconstructed data items other than the given data item.

In some embodiments, the first ECC has a first error correction capability, and the second ECC has a second error correction capability that is greater than the first error correction capability. In an embodiment, the method includes, upon failing to reconstruct two or more data items from the respective encoded data items by decoding the first ECC, re-attempting to reconstruct the two or more data items by decoding the first ECC using an erasure decoding process.

In another embodiment, reconstructing the given data item includes reconstructing the code word of the second ECC and decoding the reconstructed code word. In yet another embodiment, the second ECC is represented by a set of parity check equations, and decoding the code word includes simplifying one or more of the parity check equations in the set based on the reconstructed data items other than the given data item, and decoding the code word using the simplified parity check equations. In still another embodiment, the first ECC is represented by an additional set of parity check equations, and decoding the code word includes, after simplifying the parity check equations in the set, jointly decoding the parity check equations of the first ECC and of the second ECC. In an embodiment, the second ECC includes a Low Density Parity Check (LDPC) code.

There is additionally provided, in accordance with an embodiment of the present invention, a data storage apparatus, including:

an interface, which is configured to communicate with a memory; and a processing unit, which is configured to encode each of multiple data items individually using a first Error Correction Code (ECC) so as to produce respective encoded data items, to store the encoded data items in the memory, to encode the multiple data items jointly using a second ECC so as to produce a code word of the second ECC, to store only a part of the code word in the memory, to recall the stored encoded data items from the memory and decode the first ECC in order to reconstruct the data items, and, upon a failure to reconstruct a given data item from a respective given encoded data item by decoding the first ECC, to reconstruct the given data item based on the part of the code word of the second ECC and on the encoded data items other than the given encoded data item.

The present invention will be more fully understood from the following detailed description of the embodiments thereof, taken together with the drawings in which:

DETAILED DESCRIPTION OF EMBODIMENTS

Overview

Embodiments of the present invention that are described hereinbelow provide improved methods and devices for data storage. In some embodiments, a memory controller stores multiple data pages in a memory. The memory controller encodes the data of each memory page individually with an Error Correction Code (ECC) denoted ECC1, and stores the encoded pages in the memory. In order to retrieve the data, the memory controller reads the encoded pages from the memory and decodes ECC1.

Sometimes, however, a given page comprises a number of errors that exceeds the correction capability of ECC1, and therefore the memory controller will most likely fail to decode ECC1 for this page. In some practical cases, when considering a group of N pages, the likeliest situation is that all except one of the pages are decodable, and no more than one page has an exceedingly high number of errors.

In some embodiments, the memory controller handles such scenarios by encoding the data of the N pages jointly using an additional ECC, denoted ECC2. Encoding the N pages using ECC2 produces a single code word, which comprises data bits and redundancy bits. The memory controller stores only part of the ECC2 code word, typically only the redundancy bits of the code word and not the data bits, in the memory. (As will be explained in detail below, the data bits of the ECC2 code word are superfluous when the N-1 pages other than the failed page are decodable.)

During data retrieval, if the memory controller fails to decode ECC1 for a given page out of the N pages, it reconstructs the data of the failed page using (1) the stored part (e.g., redundancy bits) of the ECC2 code word, and (2) the decoded data of the N-1 pages other than the failed page. Since the memory controller stores only the redundancy bits of the ECC2 code word, not the entire code word, the storage overhead used by the disclosed techniques is small.

The disclosed techniques enable the memory controller to fully reconstruct the data of the N pages, even though ECC1 is not decodable for one page. Under certain circumstances, the disclosed techniques can also be applied even when ECC1 is not decodable for more than a single page.

In some embodiments, the memory controller produces the ECC2 code word by calculating a bitwise Exclusive OR (XOR) over the N pages, and then encoding the XOR result using ECC2. In alternative embodiments, the memory controller applies certain types of ECC2, e.g., a Low Density Parity Check (LDPC) code, directly to the data of the N pages. Decoding schemes for both options are described herein.

System Description

Figure 1:
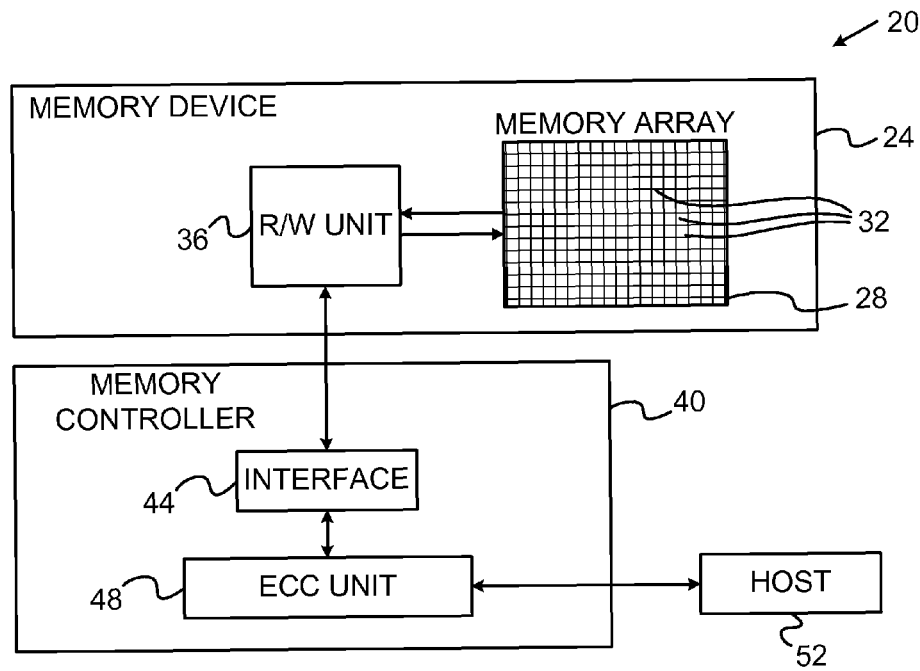
FIG. 1 is a block diagram that schematically illustrates a memory system, in accordance with an embodiment of the present invention.

FIG. 1 is a block diagram that schematically illustrates a memory system 20, in accordance with an embodiment of the present invention. System 20 can be used in various host systems and devices, such as in computing devices, cellular phones or other communication terminals, removable memory modules ("disk-on-key" devices), Solid State Disks (SSD), digital cameras, music and other media players and/or any other system or device in which data is stored and retrieved.

System 20 comprises a memory device 24, which stores data in a memory cell array 28. The memory array comprises multiple analog memory cells 32. In the context of the present patent application and in the claims, the term "analog memory cell" is used to describe any memory cell that holds a continuous, analog value of a physical parameter, such as an electrical voltage or charge. Array 32 may comprise solid-state analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells. Although the embodiments described herein refer mainly to analog memory, the disclosed techniques can also be used with various other memory types.

The charge levels stored in the cells and/or the analog voltages or currents written into and read out of the cells are referred to herein collectively as analog values, storage values or analog storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells 32 into digital samples having a resolution of one or more bits. Data is typically written to and read from the memory cells in groups that are referred to as pages. In some embodiments, the R/W unit can erase a group of cells 32 by applying one or more negative erasure pulses to the cells.

The storage and retrieval of data in and out of memory device 24 is performed by a memory controller 40. Memory controller 40 comprises an interface 44 for communicating with memory device 24, and an Error Correction Coding (ECC) unit 48. ECC unit 48 encodes the data for storage with an ECC and decodes the ECC of data that is read from memory, using methods that are described in detail below.

Memory controller 40 communicates with a host 52, for accepting data for storage in the memory device and for outputting data retrieved from the memory device. Memory controller 40, and in particular unit 48, may be implemented in hardware, e.g., using one or more Application-Specific Integrated Circuits (ASICs) or Field-Programmable Gate Arrays (FPGAs). Alternatively, the memory controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. For example, although the example of FIG. 1 shows a single memory device, in alternative embodiments memory controller 40 may control multiple memory devices 24. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 44 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. The memory array is typically divided into multiple memory pages, i.e., groups of memory cells that are programmed and read simultaneously.

Memory pages are sometimes sub-divided into sectors. In some embodiments, each page occupies an entire row of the array, i.e., an entire word line. For two-bit-per-cell devices, for example, each word line stores two pages. In alternative embodiments, each row (word line) can be divided into two or more pages. For example, in some devices each row is divided into two pages, one comprising the odd-order cells and the other comprising the even-order cells. In an example implementation, a two-bit-per-cell memory device may have four pages per row, a three-bit-per-cell memory device may have six pages per row, and a four-bit-per-cell memory device may have eight pages per row.

Erasing of cells is usually carried out in blocks that contain multiple pages. Typical memory devices may comprise thousands of erasure blocks. In a typical two-bit-per-cell MLC device, each erasure block is on the order of 32 word lines, each comprising several tens of thousands of cells. Each word line of such a device is often partitioned into four pages (odd/even order cells, least/most significant bit of the cells). Three-bit-per cell devices having 32 word lines per erasure block would have 192 pages per erasure block, and four-bit-per-cell devices would have 256 pages per block. Alternatively, other block sizes and configurations can also be used. Some memory devices comprise two or more separate memory cell arrays, often referred to as planes. Since each plane has a certain "busy" period between successive write operations, data can be written alternately to the different planes in order to increase programming speed.

Recovering from ECC Failure Using Additional Redundancy Over Multiple Pages

In some embodiments, memory controller 40 encodes the data of each memory page individually with a certain ECC, and stores the encoded pages in memory device 24. The ECC may comprise, for example, a Bose-Chaudhuri-Hocquenghem (BCH) code, a Low Density Parity Check (LDPC) code or any other suitable type of ECC. When retrieving data from memory device 24, the memory controller reads encoded pages from the memory, decodes the ECC and outputs the decoded data.

Sometimes, however, memory controller 40 may fail in decoding the ECC of a given encoded page, because the number of errors in that page exceeds the correction capability of the ECC. In some cases, the errors are not distributed evenly among the encoded pages, e.g., because of distortion or variations in the quality of the storage media between different physical locations in the memory. In these scenarios, most pages may be decoded successfully, whereas one or few pages suffer from an exceedingly high number of errors. Embodiments of the present invention that are described herein provide improved storage methods and devices, which increase storage reliability by encoding the stored data with additional redundancy that is computed jointly over multiple pages.

In some embodiments, memory controller 40 stores certain data in device 24 in N memory pages, after encoding the data of each page individually with a certain ECC (referred to herein as ECC1). In addition, the memory controller encodes the data of all N pages jointly using a second ECC denoted ECC2. The latter encoding operation produces a single code word of ECC2, which comprises data bits and redundancy bits. The memory controller stores only the redundancy bits (and not the data bits) of the ECC2 code word in device 24. When retrieving the data from device 24, memory controller reads the N encoded pages from the memory and attempts to decode ECC1 for each page. If ECC1 decoding fails for a given encoded page out of the N encoded pages, the memory controller reconstructs the failed page based on (1) the redundancy bits of the ECC2 code word, and (2) the N-1 pages other than the failed page.

Figure 2:
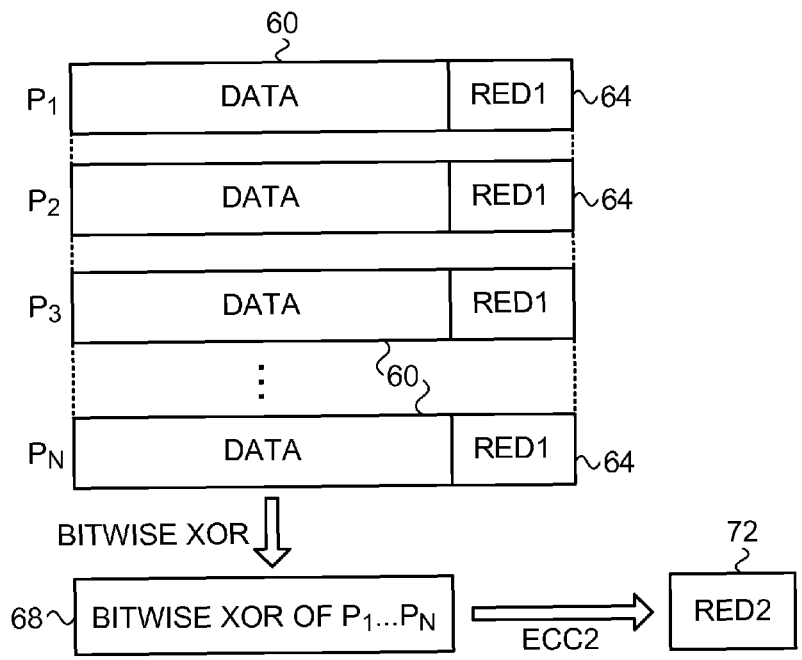
FIG. 2 is a diagram that schematically illustrates an error correction coding process over multiple memory pages, in accordance with an embodiment of the present invention.

FIG. 2 is a diagram that schematically illustrates an example error correction coding process, in accordance with an embodiment of the present invention. FIG. 2 shows a group of N data pages 60 denoted $P_1 \ldots P_N$, which contain data for storage in memory device 24. Memory controller 40 encodes each page 60 with ECC1, so as to produce respective redundancy bits 64, denoted RED1 in the figure. Each data page 60 and the corresponding RED1 redundancy bits 64 are referred to as an encoded page. After encoding with ECC1, memory controller 40 stores the N encoded pages in memory device 24.

ECC1 has a certain error correction capability, i.e., a maximum number of errors that can be corrected. If the actual number of errors in a certain page exceeds the error correction capability of ECC1, memory controller 40 will fail in decoding ECC1 for that page. In some scenarios, N-1 out of the N pages are decodable without errors, and only a single page cannot be recovered by decoding ECC1.

In order to recover the data reliably in the presence of such failure scenarios, memory controller 40 applies an additional encoding scheme, referred to as ECC2. Although the embodiments described herein refer mainly to recovery of a single failed page out of N pages, some of the disclosed techniques can also be used to recover two or more failed pages, as will be explained further below.

In the example of FIG. 2, memory controller 40 calculates a bitwise Exclusive OR (XOR) of the N un-encoded data pages 60, to produce a bitwise XOR page 68. The size of XOR page 68 is equal to the size of each page 60. Then, the memory controller encodes XOR page 68 using ECC2, to produce redundancy information 72, denoted RED2. This encoding operation produces a single ECC2 code word, in which XOR page 68 corresponds to the data bits and redundancy information 72 corresponds to the redundancy bits. Redundancy information 72 is thus computed over the data of all N pages. Memory controller 40 stores redundancy information 72 in memory device 24. XOR page 68 itself (i.e., the data bits of the ECC2 code word) is not stored.

When retrieving the N pages, memory controller 40 reads the N encoded pages from memory device 24, and attempts to decode ECC1 for each page. If ECC1 fails to decode for a certain page, the memory controller retrieves redundancy information 72 (i.e., the redundancy bits of the ECC2 code word) from memory device 24. The memory controller then reconstructs the data of the failed page using redundancy information 72 and the N-1 successfully-decoded pages.

Figure 3:
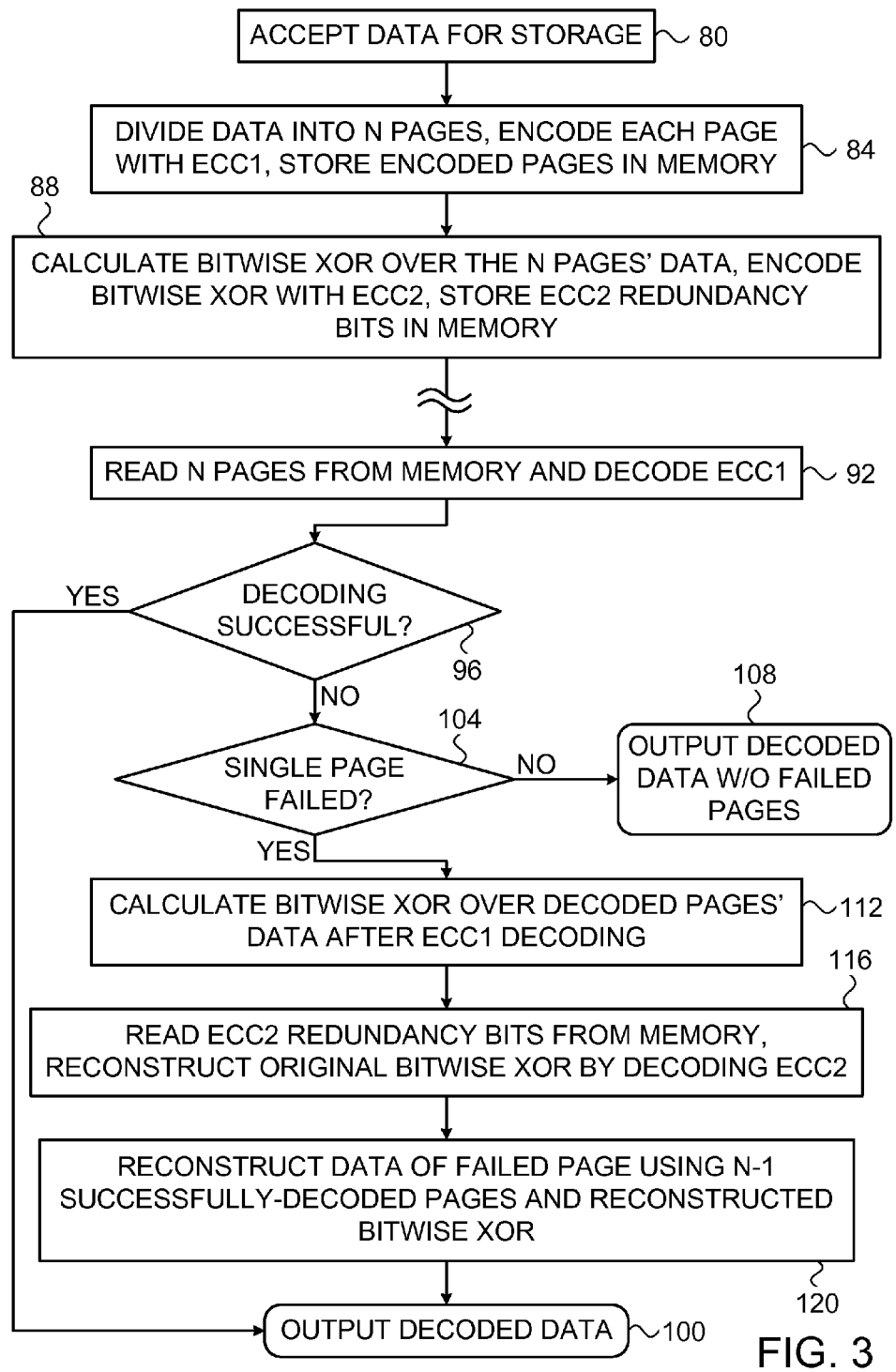
FIG. 3 is a flow chart that schematically illustrates a method for error correction over multiple memory pages, in accordance with an embodiment of the present invention.

FIG. 3 is a flow chart that schematically illustrates a method for error correction over multiple memory pages, in accordance with an embodiment of the present invention. The method begins with memory controller 40 accepting data for storage from host 52, at an input step 80. The memory controller divides the data into N pages, encodes each page using ECC1 and stores the encoded pages in memory device 24, at a page storage step 84.

Memory controller 40 encodes the data of the N pages using ECC2 so as to produce a single code word, and stores the redundancy bits of this code word in memory device 24, at an ECC2 storage step 88. In the present example, the memory controller calculates a bitwise XOR over the (un-encoded) data of the N pages, encodes the resulting bitwise XOR page using ECC2, and then stores the redundancy bits of the resulting ECC2 code word.

At a later point in time, memory controller 40 is requested to retrieve the data stored in the N pages. In order to retrieve the data, the memory controller reads the N pages from memory device 24 and attempts to decode ECC1 for each page, at a initial readout step 92. The memory controller checks whether ECC1 decoding is successful for all N pages, at a decoding checking step 96. If ECC1 was decoded successfully for all N pages, memory controller 40 outputs the decoded data to the host, at a success termination step 100, and the method terminates.

If ECC1 was not successful for all N pages, the memory controller checks whether only a single page has failed ECC1 decoding, at a single page checking step 104. If more than a single page failed ECC1 decoding, the memory controller outputs the decoded data of only the successfully-decoded pages, at a partial success termination step 108, and the method terminates. Alternatively, the memory controller may report failure without outputting any decoded data.

If only a single page out of the N pages has failed ECC1 decoding, the memory controller carries out a process that reconstructs the data of the failed page based on the redundancy bits of the ECC2 code word and on the data of the N-1 successfully-decoded pages. First, the memory controller calculates a bitwise XOR over the N pages, at a XOR calculation step 112. The bitwise XOR at this stage is calculated over the decoded data of the N-1 successfully-decoded pages, as well as the data read from the failed page (the raw data read from memory, not the result of the unsuccessful ECC1 decoding operation).

The memory controller reads the ECC2 redundancy bits (stored at step 88 above) from memory, and uses it to reconstruct the original bitwise XOR (that was computed but not stored at step 88 above), at a XOR reconstruction step 116. In the present example, the memory controller constructs an ECC2 code word, whose data bits are the bitwise XOR calculated at step 112 above, and whose redundancy bits are the ECC2 redundancy bits read from memory. The result of this ECC2 decoding operation is the original bitwise XOR that was calculated but not stored at step 88 above.

The memory controller reconstructs the data of the failed page using the original bitwise XOR derived at step 116, at a failed page reconstruction step 120. Typically, the memory controller subtracts (bitwise) a bitwise XOR of the N-1 successfully-decoded pages from the original bitwise XOR derived at step 116. The subtraction result comprises the data of the failed page. The memory controller then outputs the data of the N pages, at success termination step 100, and the method terminates.

Note that the result obtained at step 120 is correct assuming ECC2 is decoded without errors. For this purpose, ECC2 is typically designed to have a higher error correction capability than ECC1.

In an example embodiment, each page is 2 K bits in size, ECC1 comprises a BCH code with a correction capability of thirty errors per code word (T=30), ECC2 comprises another BCH code with a correction capability of sixty errors per code word (T=60), and ECC2 is calculated over twenty-four pages. Alternatively, however, any other suitable configuration can also be used.

In some embodiments, the method described above can be used to recover from ECC1 decoding failure in two (and possibly more) pages out of the N pages, assuming ECC2 was decoded successfully at step 116. In an example embodiment, the memory controller detects that ECC1 decoding has failed for two pages. In this event, the memory controller re-attempts to decode ECC1 for the two pages in question, this time using erasure decoding. Since erasure decoding is typically able to correct a higher number of errors, the erasure decoding has some likelihood of decoding one of the failed pages successfully. If the erasure decoding attempt is successful (and thus only one page has remaining errors), the method of FIG. 3 above can be applied.

In the embodiments described above, the memory controller calculates a bitwise XOR over the N pages data and then encodes the XOR result using ECC2. In alternative embodiments, the memory controller can apply ECC2 directly to the data of the N pages. In these embodiments, after successful decoding of ECC1 in all but one page, the decoded data of the N-1 successfully-decoded pages can be used to simplify one or more of the parity check equations of ECC2. The equations can be simplified by removing some of their variables, which correspond to bits that are known through the ECC1 decoding. As a result, decoding of ECC2 can be simplified considerably, thus reducing latency and power consumption.

In these embodiments, ECC2 has a much larger block size, which is equal to the number of bits in all N pages. In an example embodiment of this sort ECC2 comprises an LDPC code, although any other suitable ECC can also be used. This technique is especially suitable for LDPC, since this type of code can be decoded using the same decoder after removing some of the code word bits (some of the columns in the code's parity check matrix). In some embodiments, the parity check equations of ECC2 (after removing the variables that correspond to known bits) are joined with the parity check equations of ECC1, such that the resulting code has a higher correction capability than ECC2 alone. The memory controller then decodes this joint ECC by evaluating the parity check equations of ECC1 and ECC2 jointly.

Although the embodiments described herein mainly address memory pages, the techniques described herein can also be used with any other suitable data items that may be encoded individually with ECC1, such as sectors or word lines. Although the embodiments described herein mainly address encoding and decoding in memory systems, the methods and systems described herein can also be used in other applications, such as in communication systems. In communication applications, the pages referred to herein are replaced by ECC frames, each of which may comprise a packet or part of a packet, for example.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A system, comprising
a host;
a memory controller coupled to the host, wherein the memory controller is configured to:
receive data from the host;
partition the received data into a plurality of pages, wherein each page of the plurality of pages includes a subset of the received data;
encode each page of the plurality of pages using a first Error Correction Code (ECC) to produce a respective encoded page of a plurality of encoded pages;
generate a composite page dependent upon the plurality of pages; and
encode the composite page using a second ECC to generate a code word; and
a memory device coupled to the memory controller, wherein the memory device includes:
a plurality of memory cells; and
a read/write unit coupled to the plurality of memory cells, wherein the read/write unit is configured to:
store each encoded page of the plurality of encoded pages into a first subset of the plurality of memory cells;
store a portion of the generated code word into a second subset of the plurality of memory cells;
retrieve the plurality of encoded pages from the first subset of the plurality of memory cells; and
retrieve the portion of the generated code word from the second subset of the plurality of memory cells;
wherein the memory controller is further configured to:
decode each page of the retrieved plurality of encoded pages using the first ECC to produce a respective decoded page of a plurality of decoded pages; and
decode a given page of the plurality of decoded pages dependent upon the retrieved portion of the code word responsive to a determination that the decode of the given page failed using the first ECC.

2. The system of claim 1, wherein each memory cell of the plurality of memory cells comprises an analog memory cell.

3. The system of claim 1, wherein the second ECC comprises a Low Density Parity Check (LDPC) code.

4. The system of claim 1, wherein the generated code word comprises data bits and redundancy bits.

5. The system of claim 4, wherein the portion of the generated code word comprises the redundancy bits.

6. The system of claim 1, wherein to store each encoded page of the plurality of encoded pages, the read/write unit is further configured to convert the subset of the received data of each encoded page to analog values.

7. The system of claim 1, wherein to decode the given page of the plurality of decoded pages the memory controller is further configured to decode the given page dependent upon remaining pages of the plurality of decoded pages.

8. A non-transitory computer accessible storage medium having program instructions stored therein that, in response to execution by a computer system, causes the computer system to perform operations including:
receiving data from a host;
partitioning the received data into a plurality of pages, wherein each page of the plurality of pages includes a subset of the received data;

encoding each page of the plurality of pages using a first Error Correction Code (ECC) producing a respective encoded page of a plurality of encoded pages;

storing each encoded page of the plurality of encoded pages in a memory;

generating a composite page dependent upon the plurality of pages;

encoding the composite page using a second ECC to produce a code word;

storing a portion of the code word in the memory;

retrieving the plurality of encoded pages from the memory;

retrieving the portion of the code word from the memory;

decoding each page of the retrieved plurality of encoded pages using the first ECC producing a respective decoded page of a plurality of decoded pages; and decoding a given page of the plurality of decoded pages dependent upon the retrieved portion of the code word responsive to a determination that the decode of the given page failed using the first ECC.

9. The non-transitory computer accessible storage medium of claim 8, wherein the memory comprises a plurality of analog memory cells.

10. The non-transitory computer accessible storage medium of claim 9, wherein storing each encoded page of the plurality of encoded pages includes converting the subset of the received data of each encoded page to analog values.

11. The non-transitory computer accessible storage medium of claim 8, wherein the second ECC comprises a Low Density Parity Check (LDPC) code.

12. The non-transitory computer accessible storage medium of claim 8, further comprising decoding the given page of the plurality of decoded pages dependent upon remaining pages of the plurality of decoded pages.

13. The non-transitory computer accessible storage medium of claim 8, wherein the code word comprises data bits and redundancy bits.

14. The non-transitory computer accessible storage medium of claim 8, wherein generating the composite page dependent upon the plurality of pages includes calculating a bitwise exclusive-OR (XOR) over the plurality of pages.

15. A memory, comprising:
an array of memory cells;
a controller configured to:
receive data from a host;
partition the received data into a plurality of pages, wherein each page of the plurality of pages includes a subset of the received data;
encode each page of the plurality of pages using a first Error Correction Code (ECC) to produce a respective encoded page of a plurality of encoded pages;
store each encoded page of the plurality of encoded pages in a first subset of the memory cells;
generate a composite page dependent upon the plurality of pages;
encode the composite page using a second ECC to produce a code word;
store a portion of the code word in a second subset of the memory cells;
retrieve the plurality of encoded pages from the first subset of the memory cells;
retrieve the portion of the code word from the second subset of the memory cells;
decode each page of the retrieved plurality of encoded pages using the first ECC to produce a respective decoded page of a plurality of decoded pages; and
decode a given page of the plurality of decoded pages dependent upon the retrieved portion of the code word responsive to a determination that the decode of the given page failed using the first ECC.

16. The memory of claim 15, wherein each memory cell in the array of memory cells comprises an analog memory cell.

17. The memory of claim 15, wherein to store each encoded page of the plurality of encoded pages, the controller is further configured to convert the subset of the received data of each encoded page to analog values.

18. The memory of claim 15, wherein the portion of the code word includes redundancy data bits of the code word.

19. The memory of claim 15, wherein to generate the composite page dependent upon the plurality of pages, the controller is further configured to calculate a bitwise exclusive-OR (XOR) of each page of the plurality of pages.

20. The memory of claim 19, wherein to calculate a bitwise exclusive-OR (XOR) of each page of the plurality of pages, the controller is further configured to XOR each bit at a given bit position of each page of the plurality of pages to generate a bit of the composite page at a corresponding bit position.

* * * * *